(12) United States Patent
Ratajczak et al.

(10) Patent No.: US 10,763,437 B2
(45) Date of Patent: Sep. 1, 2020

(54) DIFFUSION-LIMITING ELECTROACTIVE BARRIER LAYER FOR AN OPTOELECTRONIC COMPONENT

(71) Applicant: INURU GMBH, Berlin (DE)

(72) Inventors: Marcin Ratajczak, Berlin (DE); Patrick Barkowski, Berlin (DE)

(73) Assignee: INURU GMBH, Berlin (DE)

( * ) Notice: Subject to any disclaimer, the term of this patent is extended or adjusted under 35 U.S.C. 154(b) by 0 days.

(21) Appl. No.: 16/333,017

(22) PCT Filed: Sep. 20, 2017

(86) PCT No.: PCT/EP2017/073753
§ 371 (c)(1),
(2) Date: Jul. 15, 2019

(87) PCT Pub. No.: WO2018/054962
PCT Pub. Date: Mar. 29, 2018

(65) Prior Publication Data
US 2019/0334090 A1  Oct. 31, 2019

(30) Foreign Application Priority Data

Sep. 20, 2016  (DE) .......................... 10 2016 117 697

(51) Int. Cl.
*H01L 51/50* (2006.01)
*H01L 51/52* (2006.01)
*H01L 51/00* (2006.01)

(52) U.S. Cl.
CPC ...... *H01L 51/0032* (2013.01); *H01L 51/5056* (2013.01); *H01L 51/5072* (2013.01);
(Continued)

(58) Field of Classification Search
CPC ..... H01L 51/50; H01L 51/52; H01L 51/0032; H01L 51/5056; H01L 51/5072;
(Continued)

(56) References Cited

U.S. PATENT DOCUMENTS

2013/0334511 A1* 12/2013 Savas ................ H01L 31/02167
257/40
2016/0111684 A1*  4/2016 Savas .................... C23C 16/308
257/40
(Continued)

FOREIGN PATENT DOCUMENTS

WO  2011018356 A1  2/2011
WO  2014048971 A1  4/2014

OTHER PUBLICATIONS

Kang, E. et al., "Organic electroluminescent devices using poly(vinylidenefluoride-co-hexafluoropropylene) doped with triphenylamine derivative as a hole-transporting layer", SPIE, 1998, pp. 336-344, vol. 3281.
(Continued)

*Primary Examiner* — Fazli Erdem
(74) *Attorney, Agent, or Firm* — Blue Filament Law PLLC (57) ABSTRACT

An optoelectronic component is provided having a cathode, an anode and a layer system between the cathode and the anode, the layer system includes electroactive layers, in particular charge-carrier injection and transport layers, and including an optically active layer, the charge-carrier injection and transport layers themselves being a diffusion barrier to water or oxygen.

19 Claims, 3 Drawing Sheets

(52) U.S. Cl.
CPC ...... *H01L 51/5206* (2013.01); *H01L 51/5221* (2013.01); *H01L 51/5237* (2013.01); *H01L 2251/10* (2013.01); *H01L 2251/303* (2013.01)

(58) Field of Classification Search
CPC ............. H01L 51/5206; H01L 51/5221; H01L 51/5237; H01L 51/0076
USPC .......................................................... 257/40
See application file for complete search history.

(56) References Cited

U.S. PATENT DOCUMENTS

| | | | |
|---|---|---|---|
| 2016/0276413 A1* | 9/2016 | Iida | H01L 27/301 |
| 2017/0096374 A1* | 4/2017 | Worfolk | C04B 35/453 |
| 2017/0098765 A1* | 4/2017 | Worfolk | H01L 51/002 |

OTHER PUBLICATIONS

Lee, K. et al., "Air-Stable Polymer Electronic Devices", Advanced Materials, 2007, pp. 2445-2449, vol. 19, © 2007 Wiley-VCH Verlag GmbH & Co. KGaA, Weinheim; DOI: 10.1002/adma.200602653.

Park, D.-H. et al., "Flexible audible display using ITO on PVDF and its interface analysis", Mater. Res. Soc. Symp. Proc., 2008, pp. 6 pages, vol. 1116, © 2009 Materials Research Society.

Lee, D.-H. et al., "Polymer Organic Light-Emitting Devices with Cathodes Transferred under Ambient Conditions", JAPANESE Journal of Applied Physics, 2011 (Published Online: Oct. 26, 2011), pp. 110206-1-110206-3, vol. 50, © 2011 The Japan Society of Applied Physics; DOI: 10.1143/JJAP.50.110206.

Kim, H.-M. et al., "Semi-transparent quantum-dot light emitting diodes with an inverted structure", Journal of Materials Chemistry C, 2014, pp. 2259-2265, vol. 2, © 2014 The Royal Society of Chemistry; DOI: 10.1039/C3TC31932F.

Subbiah, A.S. et al., "Inorganic Hole Conducting Layers for Perovskite-Based Solar Cells", The Journal of Physical Chemistry Letters, 2014, pp. 1748-1753, vol. 5, © 2014 American Chemical Society; DOI: dx.doi.org/10.1021/iz500645n.

You, J. et al., "Improved air stability of perovskite solar cells via solution-processed metal oxide transport layers", Nature Nanotechnology, 2015 (Published Online: Oct. 12, 2015), pp. 1-8, © 2015 Macmillan Publishers Limited, DOI: : 10.1038/nnano.2015.230.

English translation of International Search Report dated Nov. 3, 2017 for International Application No. PCT/EP2017/073753 filed Sep. 20, 2017.

* cited by examiner

Fig. 1

--PRIOR ART--

Fig. 2

--PRIOR ART--

Fig. 3

DIFFUSION-LIMITING ELECTROACTIVE BARRIER LAYER FOR AN OPTOELECTRONIC COMPONENT

The invention relates to an optoelectronic component, having a cathode, an anode and a layer system between the cathode and the anode, said layer system comprising electroactive layers, in particular charge-carrier injection and transport layers, and comprising an optically active layer, the charge-carrier injection and transport layers themselves being a diffusion barrier to water or oxygen.

PRIOR ART AND BACKGROUND

The invention relates to the field of optoelectronic components. Optoelectronic components, for example organic-based or hybrid components made of organic and inorganic layers, are widely used in technology.

Organic light-emitting diodes (OLEDs) usually consist of a sandwich structure, wherein there are a plurality of layers of organic semiconducting materials found between two electrodes. In particular, an OLED comprises one or a plurality of emitter layers (EL) in which electromagnetic radiation, preferably in the visible range, is produced by a recombination of electrons with electron holes. The electrons and electron holes are each provided by a cathode or anode, wherein preferably so-called injection layers facilitate the process by lowering the injection barrier. Thus, OLEDs usually have electron injection layers or hole injection layers. Furthermore, OLEDs generally have electron transport layers (ETL) and hole transport layers (HTL) which support the diffusion direction of the electrons and holes to the emitter layer. In OLEDs these layers are formed of organic materials; in hybrid optoelectronic components, the layers can be made partly of organic and partly of inorganic materials.

Compared to conventional inorganic LEDs, OLEDs and hybrid LEDs distinguish themselves by a thin and flexible layer structure. For this reason, OLEDs and hybrid LEDs can have a much more diverse use than traditional inorganic LEDs. Due to their flexibility, OLEDs can be used excellently for screens, electronic paper or interior lighting, for example.

The advantageous properties of optoelectronic components comprising organic semiconducting materials for light generation (OLEDs or hybrid LEDs) can also be transferred to the generation of electricity. Thus, organic solar cells or hybrid solar cells are also distinguished by a thin layer structure, which significantly increases the possible uses compared to conventional inorganic solar cells. The structure of organic solar cells or hybrid solar cells has similarities with OLEDs or hybrid LEDs.

Instead of an emitter layer, however, there are one or a plurality of absorber layers as the photoactive layer. Due to incident electromagnetic radiation, electron-hole pairs are generated as free charge carriers in the absorber layer. The other layers comprise electron transport layers and hole transport layers as well as electron extraction layers and hole extraction layers. These consist of organic materials or in the case of hybrids of organic and inorganic materials, the electrochemical potentials of which are shifted as donor and acceptor layers such that they generate an internal field in the solar cell, which dissipates the free charge carriers to the electrodes. As a result of the incidence of the electromagnetic radiation, electrons are provided on the cathode and electron holes are provided on the anode for generating a voltage or a current.

Due to the thin layer structure, organic solar cells can be produced cheaply and can be applied to buildings over a wide area as film coating.

Further possible applications of optoelectronic components made of organic or inorganic-organic layers are photodetectors, for example. These also use the photoelectric effect, wherein electron-hole pairs are generated in the photoactive layer. Instead of generating electricity, as in solar cells, these are used to detect light, for cameras, for example.

The thin layer structure of the above-mentioned optoelectronic components not only allow significantly more flexible use in everyday life, but is characterised in comparison to the conventional LEDs, solar cells or photodetectors by cost-effective production options.

Conversely, however, a disadvantage of the thin layer structure is a generally lower lifespan of these optoelectronic components compared to conventional structures. In particular, depredation by water vapour or oxygen on the electronic active layers leads to signs of wear and a decreasing efficiency coefficient. Unlike conventional structures, the thin layer structures are not coated by glass or other water or oxygen-resistant materials. The chemical hydrocarbon compounds of organic or hybrid components are also more susceptible to chemical or physical degradation processes.

For this reason, various techniques for encapsulating the optoelectronic components are used in the known prior art in order to prevent permeation of harmful water vapour or oxidation by oxygen.

For example, a method is described in WO 2011/018356, wherein a pressure-sensitive adhesive is applied around an electronic arrangement as a barrier layer. The barrier layer works as a capsule to prevent penetration of permeants and to extend the lifespan of the OLEDs.

In addition, WO 2014/048971 discloses an encapsulation of an optoelectronic component made of an inorganic substance mixture, which is also applied as an adhesive layer. The encapsulation is intended to achieve a hermetic sealing of the electrically active regions of an OLED or a solar cell, in particular against water vapour or oxygen.

In the known prior art, the optoelectronic components are initially produced under a protective atmosphere (usually made of nitrogen). For this purpose, solvent-based processes and thermal vapour deposition in vacuum are used. After the production of the actual organic or hybrid optoelectronic component, this is again encapsulated with a special film or glass to protect it in particular against the effects of oxygen and water. In addition, a thin layer of an absorbent material, a so-called getter material, can usually also be placed between the component and the barrier capsule (e.g. made of glass or a special plastic film). This serves to bind water or oxygen that is already present. As a barrier layer for encapsulation, glass is characterised by a low permeation to water. However, glass is not flexible. For application where a flexible, thin electronic is required, e.g. for displays, sensors, transistors, solar cells, etc. encapsulation is thus usually carried out with a plastic film which has special coatings that form the barrier layer. The plastic film, e.g. PET, PEN or similar, does not usually provide a sufficient barrier effect itself. The barrier property of these films is therefore based on the special coatings and on the following phenomenon: The water or oxygen molecules cannot normally permeate an inorganic blocking layer. However, a perfect thin inorganic blocking layer is never produced, but in the majority of cases small nanometre-sized defects appear, diffuse through the isolated molecules or migrate through them. A second layer, which is diffusion-limiting and placed between the individual inorganic blocking layers, serves to increase the (diffusion) path length of the individual water or oxygen molecules until they again reach a defect in the second blocking layer. The barrier films therefore usually comprise a structure with alternating blocking layers or diffusion barriers and diffusion-limiting layers, which overall lead to an acceptable blocking property and thus prevent permeation of water vapour or oxygen. In the prior art, permeation is usually specified by a vapour transmission rate (VTR) or specifically for water, a water vapour transmission rate (WVTR). Usually WVTR and VTR values for barrier films or barrier substrates from the prior art are between 1 to $10^{-6}$ grams water/(24 hours*$cm^2$ barrier surface) or $cm^3$ vapour/(24 hours*$cm^2$ barrier surface). The thickness of commercial barrier films or barrier substrates for encapsulation is between 25 to 100 microns (μm). For flexible applications, the barrier film is often applied to both sides of the optoelectronic component in a self-adhesive manner. In the prior art, the individual layers of the barrier film and the entire barrier film themselves do not have an electrical feature for the conduction of the charge carriers, but serve only to protect the component against degradation processes due to water or oxygen.

A disadvantage of the known methods and the use of barrier films is in particular the high layer thickness. Due to a necessary carrier substrate, i.e. Usually a plastic film, as well as the functional barrier layers, i.e. The described inorganic blocking layers (diffusion barriers) as well as diffusion-limiting layers, the overall thickness of a barrier film is at least 50 μm. The optoelectronic component to be encapsulated itself usually only approx. 50 μm thick. With encapsulation on both sides, the encapsulation thus leads to a tripling of the thickness of the component to a total minimum thickness of 150 μm compared to the possible 50 μm. As a result, the component to be encapsulated increases in rigidity and its flexibility decreases. As a result, the possible applications are significantly limited, for example, in relation to electronic paper. In addition, in the encapsulation of the components, problems can occur with barrier films at the edges of the component to be bonded. At these points, due to the flexibility, there is an increased mechanical load and the barrier film may come off despite the adhesive layer and adhesive, which leads to reduced protection and a reduced service life. In addition, during encapsulation, i.e. In particular during the sticking of the barrier films, gas pockets often occur between the barrier film and the component. This increases the failure rate of the produced optoelectronic components and thus the costs. Due to the relatively high costs of the barrier films and the necessity of an additional process step, which increases the likelihood of a defect occurring, the production costs are further increased. In addition, the optical properties may be limited due to reduced transmission and higher dispersion of the barrier films.

Layered OLEDs are also known from the prior art which have individual functional elements, for example electrodes, with barrier-like properties. However, no OLEDs are known with associated individual injection or extraction and transport layers that also have all barrier-like properties to water and oxygen. Furthermore, it is not known to use printing methods for constructing such OLEDs.

OBJECT OF THE INVENTION

The object of the invention was thus to provide an optoelectronic component that improves on the mentioned drawbacks of prior art. In particular, an optoelectronic component should be provided which is distinguished from the prior art by a cost-effective production, high durability and high flexibility due to a low thickness.

SUMMARY OF THE INVENTION

The object according to the invention is achieved through an optoelectronic component and a method for producing said component according to the independent claims. The independent claims represent preferred embodiments of the invention.

In a preferred embodiment, the invention relates to an optoelectronic component with a cathode and an anode and a layer system between the cathode and the anode comprising at least one electron injection layer or electron extraction layer adjacent to the cathode, at least one electron transport layer, at least one optically active layer, at least one hole transport layer, at least one hole injection layer or hole extraction layer adjacent to the anode, characterised in that the at least one electron injection layer or electron extraction layer and the at least one hole injection layer or hole extraction layer are diffusion-limiting to water and/or oxygen and the at least one electron transport layer and the at least one hole transport layer represent a diffusion barrier against water and/or oxygen.

The optoelectronic component according to the invention is preferably characterised in that this comprises electrodes (i.e. an anode or cathode), an optically active layer and electrically active layers (i.e. in particular the charge carrier injection layers or charge carrier extraction layers and charge carrier transport layers). The function of the optoelectronic component is preferably characterised by the optically active layer which in particular serves to generate light or electricity. For the purposes of the invention, the electrically active layers preferably refer to layers which ensure the electrical functionality of the component and are arranged between the optically active layer and the electrodes. For the purposes of the invention, the charge carrier injection layers or charge carrier extraction layers and charge carrier transport layers are electrically active layers. Furthermore, for the purposes of the invention, charge carriers preferably refer to electrons or electron holes. The terms hole and electron hole are preferably used synonymously in the following. The person skilled in the art knows how to arrange the electrically active layers in order to achieve the desired function of the optoelectronic component dependent on the optically active layer Essentially, the invention preferably relates to two groups of optoelectronic components. In the first group, the optically active layer is preferably an emitter layer which serves to generate light. In this case, the optoelectronic component is preferably used as an organic or hybrid light-emitting diode (LED). In the second group the optically active layer is preferably an absorber layer in which free charge carriers are generated through the absorption of electromagnetic radiation. In the second group, the optoelectronic components are thus preferably organic or hybrid solar cells or photodetectors.

As described above, the electrical layers are selected in order to ensure the function of the optically active layer of the component.

In a preferred embodiment, the invention relates to an optoelectronic component for generating light, for example as a light-emitting diode. In this preferred embodiment, the optoelectronic component has a cathode and an anode and a layer system between the cathode and the anode comprising at least one electron injection layer adjacent to the cathode, at least one electron transport layer, at least one optically active layer which is an emitter layer, at least one hole transport layer, at least one hole injection layer adjacent to the anode and is characterised in that the at least one electron injection layer and the at least one hole injection layer are diffusion-limiting to water and/or oxygen and the at least one electron transport layer and the at least one hole transport layer represent a diffusion barrier against water and/or oxygen.

In this preferred embodiment, the cathode serves as an electron supplier. Preferably, the cathode has a low sheet resistance in order to facilitate the most uniform possible injection of the electrons across the surface of the OLED.

The electron injection layer, on the other hand, performs the function of matching the work function of the cathode and the following layer, the electron transport layer. The work function preferably corresponds to the energy that must be expended to at least remove an electron from an uncharged solid. By matching the work function of the cathode to the electron transport layer, the voltage necessary to inject electrons from the cathode into the electron transport layer is reduced.

The electron transport layer provides the directed electron transport between the cathode and the optically active layer, i.e. the preferred embodiment of the emitter layer. Thus, the electron transport layer should preferably have sufficient movement or mobility of electrons (preferably of $10^{-6}$ to 100 $cm^2/(V*sec)$). In addition, the charge transport energy level, i.e. the charge band or LUMO (lowest unoccupied molecular orbital) of the electron transport layer should preferably be between the energy level of the emitter material and the work function of the cathode, i.e. that after performing the work function, no additional energy is required to transport the electrons before recombining with the holes.

The emitter layer preferably consists of semiconducting organic polymers or molecules, which upon electrical stimulation produce light in the visible range, i.e. preferably in a wavelength range of 400 to 700 nm. In the emitter layer, the electrons of the cathode preferably recombine with the holes of the anode to form excitons. Preferably, the amount of singlet excitons is predominant so that light is effectively generated.

The hole transport layer is the counterpart to the electron transport layer and serves to transport (electron) holes from the anode to the emitter layer. Preferably, the hole transport layer should thus have sufficient movement or mobility of electron holes, preferably of $10^{-6}$ to 100 $cm^2/(V*sec)$. In addition, the energy level of the transport of electron holes, i.e. the charge band or HOMO (highest occupied molecular orbital) of the hole transport layer should preferably be between the energy level of the emitter material and the work function of the anode.

The hole injection layer, like its counterpart on the cathode side (the electron injection layer), preferably consists of strongly dielectric polymers and is preferably an insulator. Preferably, the hole injection layer serves to equalise the energy levels of the anode and the following layer, the hole transport layer, to ensure effective injection of electron holes.

The anode is preferably the electron hole supplier and thus preferably has a significantly higher work function than the cathode. Furthermore, it is preferable for the anode to have a high surface conductivity for holes. In addition, it may be preferably for the anode material to be transparent to preferably allow light emission through the anode.

In this preferred embodiment, the optically active layer is an emitter layer and the electrically active layers at least one electron injection layer, at least one electron transport layer, at least one hole transport layer and at least one hole injection layer.

For the preferred embodiment in which instead of light generation, power generation by the component should occur, a person skilled in the art will be able to adapt the electrically active layers and optically active layers as follows.

The optically active layer used is preferably an absorber layer which is able to convert the energy of the incident electromagnetic radiation into the generation of free charge carriers by photon absorption. The electrically active layers preferably ensure that an internal electric field is generated within the optoelectronic component, which removes the charge carriers from the corresponding electrodes. The electrons are extracted at the cathode, while the holes are extracted at the anode. The potential difference provided thereby serves to generate electrical voltage or, under charge, electrical current.

In this preferred embodiment of the optoelectronic component, the layer structure is preferably as follows.

The optoelectronic component has a cathode and an anode and a layer system between the cathode and the anode comprising at least one electron extraction layer adjacent to the cathode, at least one electron transport layer, at least one optically active layer which is an absorber layer, at least one hole transport layer, at least one hole extraction layer adjacent to the anode and is characterised in that the at least one electron extraction layer and the at least one hole extraction layer or are diffusion-limiting to water and/or oxygen and the at least one electron injection layer and the at least one hole transport layer represent a diffusion barrier against water and/or oxygen.

The electrically active layers are in turn designed to ensure the function of the absorber layer and an effective extraction of the charge carriers. In this preferred embodiment, the optically active layer is an absorber layer and the electrically active layers the at least one electron extraction layer, the at least one electron transport layer, the at least one hole extraction layer and the at least one hole transport layer.

According to the invention, it has been found that in order to extend the service life of the optoelectronic components, in particular protection of the optically active layer from the damaging effect of water or water vapour and oxygen should occur. While mostly in the prior art encapsulation of the entire component occurs, according to the invention the electrically active layers are used to fulfil a blocking function against water or oxygen.

In the light-generating components, the at least one electron injection layer and the at least one hole injection layer are diffusion-limiting to water and/or oxygen. The at least one electron transport layer and the at least one hole transport layer form a diffusion barrier against water and/or oxygen.

Conversely, in the case of electricity-generating components, the electron extraction layers and hole extraction layers are diffusion-limiting to water and/or oxygen. The at least one electron transport layer and the at least one hole transport layer also form a diffusion barrier against water and/or oxygen.

Due to this dual functionality of the electrically active layers, both as permeation barriers for water and oxygen, as well as to support the directional current of the charge carriers, the components can be constructed significantly more compactly. While in the prior art it is necessary to use barrier films, whereby the overall thickness of the component is often increased three times; this is advantageously eliminated in the layer structure according to the invention. Thus, the optoelectronic components are significantly more flexible and can be implemented flexible. There are also no additional production steps for the application of the barrier films, whereby the production process is significantly simplified and made less expensive. By using the electrically active layers as diffusion-limiting layers or diffusion barriers, the components can be produced more reliably and cost-effectively than is possible in the prior art. The technical progress that is achieved by the invention is further shown in a more powerful component, which with the same electrical power consumption has a higher intensity and better optical properties (lower dispersion, monochromatic light) or generation of greater electrical power at the same intensity of solar radiation. Here, the innovative research and the methodical approach of the inventors has paid off through the use of electroactive layers as a barrier against oxygen and water, and a new path was taken.

It was surprising that electrically active layers can be provided which allow both the blocking function and the electrical function for guiding the charge currents. Due to the fact that each individual layer, which has an electrical function, also takes on a blocking function against oxygen and water, a surprisingly effective barrier to these can be achieved. The barrier function of each individual layer thus significantly increases the lifespan of the optoelectronic component. The effect that can be achieved by the interaction of different barrier layers is significantly greater than that of a single barrier layer. The more layers with barrier properties are arranged one above the other, the greater the effect of their non-linear interaction, in which the combination of several barrier layers preferably has a higher barrier effect than would be achieved with the sum of the barrier effects of the individual layers. This shows a synergistic effect. In this connection, barrier properties and blocking properties refer to both diffusion-limiting properties and diffusion-blocking properties.

In contrast to the use of barrier films, there are also not problems at the edges of the component. Macroscopic gas inclusions, such as occur in barrier films, can be effectively prevented thanks to the microscopic structure of the electroactive layers, in contrast to the macroscopic structure of a barrier film.

It was surprising that the barrier properties and the desired electrical properties of the electroactive layers could be achieved in particular by selecting suitable materials and layer thicknesses, as described below.

For the purposes of the invention, the property "diffusion-limiting to water and/or oxygen" preferably means that the corresponding injection layers or extraction layers significantly reduce the diffusion of water and/or oxygen molecules. Thus, it may be preferably for the path length of the water and oxygen molecules in the layer to be increased by the diffusion-limiting layers so that the molecules do not reach the optically active layers.

In a preferred embodiment, the diffusion-limiting layers have a water vapour transmission rate (WVTR) of less than 1 g/(m$^2$*d) and an oxygen transmission rate (OTR) of less than 1 cm$^3$/(m$^2$*d).

For the purposes of the invention, the property "diffusion barrier" is preferably understood to mean that the corresponding electron transport layers or hole transport layers prevent or significantly reduce the permeation of water and/or oxygen molecules. In a preferred embodiment, the electron transport layers or hole transport layers as diffusion barriers have a water vapour transmission rate (WVTR) of less than 0.1 g/(m$^2$*d) and an oxygen transmission rate (OTR) of less than 0.1 cm$^3$/(m$^2$*d).

However, it is particularly preferably for the blocking properties of the electrically active layers together with the electrodes to satisfy conditions which ensure effective protection of the optically active layer from permeation of water or oxygen.

In a further preferred embodiment, the optoelectronic component is characterised in that a layer combination of a cathode, the at least one electron injection layer or electron extraction layer and the at least one electron transport layer has a water vapour transmission rate (WVTR) of less than 0.01 g/(m$^2$*d) and an oxygen transmission rate (OTR) of less than 0.01 cm$^3$/(m$^2$*d) and/or a layer combination of an anode, the at least one hole injection layer or hole extraction layer and the at least one electron transport layer has a water vapour transmission rate (WVTR) of less than 0.01 g/($^2$*d) and an oxygen transmission rate (OTR) of less than 0.01 cm$^3$/(m$^2$*d). Depending on their composition and thickness, the layers can be routinely adapted by the person skilled in the art so that the mentioned transmission rates can be achieved.

It has been recognised that, preferably, the individual diffusion-limiting layers or diffusion barriers must not satisfy quantitative blocking properties, but in particular the layer combination, preferably of the electrode and the electrically active layers to the optically active layer. Thus, it may be preferable for the combination of an electrode and an injection layer or extraction layer and a transport layer to preferably have a WVTR or OTR of less than 0.01 g/(m$^2$*d) or less than 0.01 cm$^3$/(m$^2$*d). However, it may also be preferable for the component to comprise a plurality of preferably alternating injection layers or extraction layers and transport layers, wherein the layer combination, for example the cathode and all electron injection layers and electron transport layers, has a WVTR or OTR of less than 0.01 g/(m$^2$*d) or less than 0.01 cm$^3$/(m$^2$*d). The same applies correspondingly for the other electrically active layers. I.e. it may also be preferable for the layer combination of the anode and all hole injection layers and hole transport layers to have a WVTR or OTR of less than 0.01 g/(m$^2$*d) or less than 0.01 cm$^3$/(m$^2$*d). For the embodiment of the power-generating components, such as solar cells or photodetectors, the injection layers are to be replaced by extraction layers in the layer combinations.

Surprisingly, said values of the WVTR or OTR for the layer combinations of less than 0.01 g/(m$^2$*d) or less than 0.01 cm$^3$/(m$^2$*d) lead to a particularly effective protection of the optically active layers. Thus, for the preferred embodiment, the lifespans of the preferred solar cells or LEDs significantly increase.

This embodiment with the above-mentioned values represents a particularly maintenance-free component due to the strong, synergistic barrier properties which result from the combination of the individual layers.

The light-emitting construction of the component plays an important role for the use in print products. The embodiment presented here has proven to be particularly less error-prone in paper printing.

It can also be preferred that in a further preferred embodiment, the optoelectronic component is characterised in that a layer combination of a cathode, the at least one electron injection layer or electron extraction layer and the at least one electron transport layer has a water vapour transmission rate (WVTR) of less than 0.1 g/(m$^2$*d) and an oxygen transmission rate (OTR) of less than 0.1 cm$^3$/(m$^2$*d) and/or a layer combination of an anode, the at least one hole injection layer or hole extraction layer and the at least one electron transport layer has a water vapour transmission rate (WVTR) of less than 0.1 g/($^2$*d) and an oxygen transmission rate (OTR) of less than 0.1 cm$^3$/(m$^2$*d). Thus, it may be preferable for the combination of an electrode and an injection layer or extraction layer and a transport layer to preferably have a WVTR or OTR of less than 0.1 g/(m$^2$*d) or less than 0.1 cm$^3$/(m$^2$*d). However, it may also be preferable for the component to comprise a plurality of preferably alternating injection layers or extraction layers and transport layers, wherein the layer combination, for example the cathode and all electron injection layers and electron transport layers, has a WVTR or OTR of less than 0.1 g/(m$^2$*d) or less than 0.1 cm$^3$/(m$^2$*d). The same applies correspondingly for the other electrically active layers. I.e. it may also be preferable for the layer combination of the anode and all hole injection layers and hole transport layers to have a WVTR or OTR of less than 0.1 g/(m$^2$*d) or less than 0.1 cm$^3$/(m$^2$*d). For the embodiment of the power-generating components, such as solar cells or photodetectors, the injection layers are to be replaced by extraction layers in the layer combinations.

By recognising that it may be sufficient for certain embodiments to realise said values for the layer combinations, particularly thin layers can be used to achieve the desired functions.

Surprisingly, said WVTR or OTR values for the layer combinations of less than 0.1 g/(m$^2$*d) or less than 0.1 cm$^3$/(m$^2$*d) lead to a component with particularly reliable electrical properties that can be determined in advance, which is at the same time sufficiently protected against oxygen and water. Furthermore, it is possible to use particularly thin layers with simultaneously good protective properties and thus a long lifespan of the component. Thus, a surprisingly long-lasting and flexible component is realised.

In this way, light-emitting components with particularly advantageous aesthetic properties (optical brilliance) can also be realised. Thus, light-emitting components with the above-mentioned properties can also be used for very thin paper, such as that of daily newspapers, in order to achieve an optical effect (for example flashing lights for vehicle advertising).

For the purposes of the invention, it is preferable for the water vapour transmission rate (WVTR) to represent a measured value for the permeability of water vapour or water molecules through the single layer or through the layer combination. To determine the WVTR value, it is preferable to determine the mass of the water molecules which diffuse through an area of the layer within 24 hours. In the present case, the preferred unit is the WVTR in g/(m$^2$*d), wherein the SI units g stands for grams, d stands for day, i.e. 24 hours, and m$^2$ stands for square metres of the area of the layer or layer combination.

In the same way, it is preferred for the purposes of the invention for the oxygen transmission rate (OTR) to represent a measured value for the permeability of oxygen molecules through the single layer or through layer combination. To determine the OTR value it is preferable to determine the gas volume of the oxygen molecules which diffuse through an area of the layer within 24 hours. In the present case, the preferred unit is the OTR in cm$^3$/(m$^2$*d), wherein the SI units cm$^3$ stands for cubic centimetres, d stands for day, i.e. 24 hours, and m$^2$ stands for square metres, i.e. of the area of the layer or layer combination.

The person skilled in the art knows how the OTR and WVTR of thin films can be experimentally determined and therefore can select the layers according to these properties.

Experimental tests to determine the OTR and WVTR of thin layers of optoelectronic components are disclosed, for example, by the American Society for Testing and Materials (ASTM) under ASTM D1653-13 with the title Standard Test Methods for Water Vapor Transmission of Organic Coating Films. The documentation for the description of the tests was downloaded from https://www.astm.org/Standards/D1653.htm on Sep. 12, 2016.

In a preferred embodiment of the invention, the optoelectronic component is characterised in that the at least one electron transport layer and the at least one hole transport layer have an oxygen transmission rate (OTR) of less than 0.1 cm$^3$/(m$^2$*d) and a water vapour transmission rate (WVTR) of less than 0.1 g/(m$^2$*d). Advantageously, these parameter values for the individual transport layers lead to effective avoidance of permeation of water or oxygen molecules. It has been found by the inventors that the electron transport layer and the hole transport layer are of particular importance in this regard as they directly surround the optically active layer. A particularly reliable and long-lasting component can be made available with the above-mentioned values.

In a further preferred embodiment of the invention, the optoelectronic component is characterised in that the at least one electron transport layer and the at least one hole transport layer have an oxygen transmission rate (OTR) of less than 1 cm$^3$/(m$^2$*d) and a water vapour transmission rate (WVTR) of less than 0.1 g/(m$^2$*d). Advantageously, particularly with a hole transport layer characterised in this way, the desired electrical properties can be achieved particularly reliably, while at the same time achieving the barrier properties of the layer system required for a long lifespan. Furthermore, the production process is thus facilitated and the production costs are reduced.

In a preferred embodiment of the invention, the optoelectronic component is characterised in that the at least one electrode transport layer has an electron mobility between $10^{-6}$ cm$^2$/(V*s) and 10 cm$^2$/(V*s) and preferably a LUMO between 3-4 eV and the at least one hole transport layer has a hole mobility between 10-6 cm$^2$/(V*s) and 100 cm$^2$/(V*s) and preferably a HOMO between 5 and 7 eV.

The mobility of the charge carrier, i.e. preferably the mobility of the electrons (electron mobility) and the mobility of the holes (hole mobility), preferably designates the linear proportionality factor between the drift velocity of the charge carriers and an electrical field. This charge carrier mobility is a material property and is generally dependent on the temperature. The above-mentioned parameters preferably apply for a room temperature of 25° C. at which the component is preferably used. Due to said charge mobility values, the charge carriers are transported particularly effectively to the recombination zone (in the case of light-emitting diodes) or to the electrodes (in the case of solar cells). Thus, light-emitting diodes or solar cells can be produced particularly efficiently. The heat development can also be reduced during operation and the reliability can thus be increased.

The LUMO (lowest unoccupied molecular orbital) designates the lowest unoccupied orbital of the molecule of the electron transport layer in which the electrons can move as free charge carriers. Whereas the HOMO (highest occupied molecular orbital) designates the highest occupied orbital of the molecule of the hole transport layer in which the holes can move as free charge carriers. The above-mentioned parameters for the LUMO and HOMO are optimised for the energy bands of the optically active layers, which preferably either emit or absorb electromagnetic radiation in the visible range.

Particularly by selecting suitable materials and layer thicknesses, which leads to the above-mentioned electrical properties for the at least one electron or hole transport layer, or on the other hand to the desired barrier properties, a component with the desired optoelectronic properties can be realised, which at the same time as a long lifespan. Furthermore, the performance of the component can be increased.

In a preferred embodiment, the optoelectronic component is characterised in that the at least one electron transport layer has a doped metal oxide, preferably a doted zinc oxide, wherein the doping is preferably carried out with aluminium, alkali, alkaline earth, metallocenes and/or organic n-dopants and the electron transport layer particularly preferably has an aluminium zinc oxide. Surprisingly, electron transport layers made of these materials, in particular of a doped aluminium zinc oxide, are distinguished by a particularly good diffusion barrier against water and oxygen molecules and moreover have optimum electrical properties as a result of the doping. It is particularly preferable for the electron transport layer to be made from the above-mentioned materials and thus have a LUMO between 3-4 eV and electron mobility between $10^{-6}$ cm$^2$/(V*s) and 100 cm$^2$/(V*s). It is known to the person skilled in the art how to provide materials having the above-mentioned parameters without being inventive.

In a preferred embodiment of the invention, the optoelectronic component is characterised in that the at least one hole transport layer comprises a doped metal thiocyanate, preferably a doped copper thiocyanate and/or a doped metal oxide, preferably a doped zinc oxide. These materials can be particularly advantageously adapted to the desired properties by a corresponding doping. In addition, they have the desired barrier properties against oxygen and water. Furthermore, these materials are very robust and thus contribute to the production of a reliable component. Preferably, the materials are doped with a metal thiocyanate. Metal thiocyanates are particularly well suited for doping. In addition, a wide range of properties set by doping can be achieved with them. The metal thiocyanates are preferably selected from a group comprising sodium thiocyanate, potassium thiocyanate, silver thiocyanate, tungsten thiocyanate, vanadium thiocyanate, molybdenum thiocyanate, copper thiocyanate and/or other transition metal thiocyanates. Dopings selected from the above group allow the targeted adjustment of desired electrical properties. In individual cases even synergistic effects can be achieved due to a further improvement of the already good barrier properties of the doped base material. It can also be advantageous to dope with a metal oxide. Metal oxides are characterised by a particularly uncomplicated and therefore reliable workability. Preferably, metal oxides to be doped selected from a group comprising tungsten oxides, vanadium oxide, nickel oxide, copper oxide, molybdenum oxide and/or other transition metal oxides are used. These are characterised by great doping effectiveness. Only a few steps are required for their processing. However, it may be preferable to dope with halogens such as fluorine, chlorine, bromine and iodine. These are characterised by their distinctive chemical reactivity and by their high occurrences in nature.

For the hole transport layer, it is thus preferable to dope a metal thiocyanate, particularly preferably a copper thiocyanate or even a metal oxide, particularly preferably a zinc oxide. The person skilled in the art knows that doping in the context of optoelectronic components preferably means the introduction of foreign atoms, the dopants, into a layer, the amount introduced being generally lower in comparison to the carrier material. I.e. it may be preferable for the weight percentage of the dopant to be less than 10%, preferably less than 1% of the entire layer. It may also be preferable for the weight percentage of the dopant to be up to 40% of the entire layer. With so-called p-type doping, electron acceptors are doped, whereas with so-called n-type doping, electron donors are doped. For the hole transport layer, it is preferable to select materials which have acceptor properties and preferably have a LUMO close to the HOMO of the carrier of the metal thiocyanate or metal oxide, preferably of the copper thiocyanate or zinc oxide. For example, an organic p-type dopant can preferably also be tetrafluorotetracyanoquinodimethane or even hexaazatriphenylenehexacarbonitrile. These have proven to be particularly useful. They can lead to further advantages such as higher performance and reliability as well as a high yield.

It is particularly preferable to use copper thiocyanate or zinc oxide with the above-mentioned suitable dopants as the carrier of the hole transport layer.

It was surprising that with the abovementioned materials for the hole transport layers, in particular using copper thiocyanate or zinc oxide, permeation of water or oxygen can be prevented particularly effectively, while at the same time having excellent electrical properties for transporting the electron holes. It is particularly preferable, by doping, for the hole transport band to have a mobility of holes between $10^{-6}$ cm$^2$/(V*s) and 100 cm$^2$/(V*s) and the carrier and for the dopants to be selected such that the HOMO of the hole transport band is between 5 eV and 7 eV. Thus, the optically active component can be operated particularly reliably and effectively.

In a preferred embodiment of the invention, the optoelectronic component is characterised in that the at least one electron transport layer has an overall layer thickness of 10-50 nm, which is particularly robust and reliable. Thus, it is preferably that it has an overall layer thickness of 25-30 nm. This has proven to be particularly maintenance-free and easy to manufacture, whereby costs are reduced. The at least one hole transport layer has an overall layer thickness of 10-40 nm, which is also particularly robust and reliable. Thus, an overall layer thickness of 10-30 nm is preferable. This has also proven to be particularly maintenance-free and easy to produce and therefore reduces the costs. It is particularly preferably for the total layer thickness of the hole transport layer to have a thickness of 15-25 nm. This represents an improvement of the electrical properties. The total layer thickness preferably designates the thickness of all electron transport layers or hole transport layers. In the case of the use of an electron transport layer or hole transport layer, the thickness corresponds to the thickness of the electron transport layer or hole transport layer. For the purposes of the invention, the thickness preferably designates the extent of a layer along the layer structure between the electrodes and along the charge carrier transport. The above-mentioned parameters are advantageously optimised on the one hand to implement effective protection of the optically active layer, in particular against oxygen and water, and on the other hand to implement a particularly thin overall structure of the optoelectronic component. Thus, a particularly durable, yet thin, flexible component can be provided. Furthermore, the reliability is increased and a particularly aesthetic effect can be achieved due to the thin, invisible layers. These contribute synergistically to the aesthetic effect in an emitting device and also in that the light transmission of the layers increases and their scattering is reduced.

In a further preferred embodiment of the invention, the optoelectronic component is characterised in that the at least one electron injection layer or electron extraction layer and the at least one hole injection layer or hole extraction layer have an oxygen transmission rate (OTR) of less than 1 $cm^3/(m^2*d)$ and a water vapour transmission rate (WVTR) of less than 1 $g/(m^2*d)$. If these outer layers of the component have the above-mentioned properties, a particularly effective protection of the inner elements can be ensured. This protection already has a positive effect during production when the device is particularly sensitive and increases reliability.

In the component, inflow of water molecules and oxygen molecules into the component may occur due to nanodefects in the electrodes. According to the invention, it is preferably for the transport layers for the charge carriers to represent a diffusion barrier for these permeants. The injection layers or extraction layers are preferably found between the electrodes and the transport layers and are preferably diffusion-limiting. A particularly for limiting of the diffusion of water and oxygen can be achieved with the above-mentioned parameters for the OTR and WVTR of the injection layers or extraction layers. As a result, the path lengths of the molecules are greatly extended so that an exit—e.g. by a defect in the electrodes—becomes much more likely than diffusing towards the sensitive optically active layer. The preferred embodiment thus increases the lifespan of the component to a certain degree. Due to the diffusion-limiting properties of the injection layers or extraction layers in combination with the diffusion barrier realised by the transport layers, a particularly effective protection of the optically active layer can be realised. The diffusion protection which results from the combination of the layers is surprisingly higher than protection provided solely by the transport layers. This effect, as stated above, is synergistic, i.e. the protection is considerably stronger than would be expected from the sum of the protective effects of the individual layers.

In a preferred embodiment of the invention, the optoelectronic component is characterised in that the at least one electron injection layer or electron extraction layer comprises dielectric polymers. These are characterised by a particular robustness, whereby a long-lasting component can be satisfied. Their good barrier properties create synergies that also have a positive effect on longevity. It is particularly preferable to use hydrophilic polymers and/or polyelectrolytes. These can be particularly easy to process and thus result in a saving of time, materials and working stages, and consequently of costs. Most particularly preferably, polymers are selected from a group comprising polyoxazolines, polymethacrylates, polyacrylamides, polyethylene oxides, polyacrylic acids, polyacrylates, polyvinylpyrrolidone and copolymers of this group. These have proven to be particularly useful and are characterised by superior electrical properties. In particular the use of polyvinyl alcohol, polyethylenimine or ethoxylated polyethylenimine is preferred as these lead to a further improvement and increased performance of the component.

The above-mentioned materials are particularly suitable for ensuring the electrical function of the injection layers or extraction layers for electrons. Thus, the electrons as charge carriers can use the quantum effect of "tunnelling" and jump either from the cathode into the electron transport layer (in the case of the electron injection layer) or from the electron transport layer to the cathode (in the case of the electron extraction layer). The above-mentioned dielectric polymers preferably generate corresponding surface dipoles and thus reduce the injection barrier for electrons. Similarly, the mobility of oxygen and water molecules in the layers is surprisingly greatly reduced or restricted. Thus, the above-mentioned materials permit the preferred valued for the OTR of less than 1 $cm^3/(m^2*d)$ and for the WVTR of less than 1 $g/(m^2*d)$ to be implemented particularly reliably.

In a preferred embodiment of the invention, the optoelectronic component is characterised in that the at least one hole injection layer or hole extraction layer comprises dielectric polymers. These have superior barrier properties and thus increase reliability. These are preferably polymers with functional groups selected from a group comprising —CN, —SCN, —F, —Cl, —I and/or —Br, which are particularly robust and maintenance-free. Thus, the at least one hole injection layer or hole extraction layer particularly preferably comprises polyvinylidene fluoride (PVDF), polyvinylidene chloride (PVDC), polyacrylonitrile (PAN) and/or a copolymer of these, which causes an improvement and an increased performance of the component.

The above-mentioned materials are particularly suitable for ensuring the electrical function of the injection layers or extraction layers for electron holes. In particular, the above-mentioned polymers fulfil the preferred injection property, i.e. an increase of the work function for electrons at the contact surfaces to the injection layer and thus an effective hole injection. Furthermore, the materials have excellent barrier properties against water and oxygen. Some of the above-mentioned materials are already used as food films. It was surprising that injection layers or extraction layers for electron holes which ensure both a particularly energy-efficient function of the component and a particularly long lifespan could be provided using these materials.

In a further preferred embodiment, the optoelectronic component is characterised in that the at least one electron injection layer or electron extraction layer has a total layer thickness between 0.1 and 10 nm. Such a layer thickness can be processed particularly reliably and contributed to the improvement of the electrical and optical properties. A layer thickness of between 5 nm and 7 nm is particularly preferable as an ideal compromise between the desired optical and electrical properties is achieved here on the one hand, and on the other hand an increase in quality of the production method is achieved. For the at least one hole injection layer or hole extraction layer, a total layer thickness between 0.1 nm and 10 nm is preferable.

The advantages that apply for the electron injection layer or electron extraction layer also apply here. The same applies for the particularly preferred layer thickness between 5 nm and 7 nm. The total layer thickness preferably quantifies the total extent of each electron injection layer or electron extraction layers or each hole injection layer or hole extraction layer. In the case of a layer, the total layer thickness is preferably equal to the thickness of the layer, otherwise equal to the sum of the thickness of the individual layers. It has been found by the inventors that the above-mentioned layer thicknesses surprisingly allow both excellent blocking properties against water and oxygen, as well as effective "tunnelling", whereby the electrical function is fulfilled.

In a further preferred embodiment of the invention, the optoelectronic component is characterised in that the component has at least two electron injection layers or electron extraction layers, at least two electron transport layers, at least two hole transport layers and at least two hole injection layers or hole extraction layers, wherein the electron injection layers or electron extraction layers and the electron transport layers and the hole injection layers or hole extraction layers and the hole transport layers are arranged in an alternating arrangement. For the purposes of the invention, the alternating arrangement preferably means that the injection layers or extraction layers preferably alternate with the transport layers. For example, a preferred layer structure for two electron transport layers and two electron injection layers would be as follows: the first injection layer adjoins the cathode, followed by the first transport layer, the second injection layer and the second transport layer, which adjoins the optically active layer. Through the preferred use of several injection layers and transport layers, a particularly effective protection against permeation of water and oxygen can be achieved. Through the alternating arrangement, a surprising increase of the blocking properties of the layers results, even with a low thickness of the individual layers. This synergistic effect, in particular in the case of an alternating arrangement of the layers, is greater than would be assumed by the sum of the blocking properties of the individual layers.

In a further preferred embodiment of the invention, the optoelectronic component is characterised in that the anode comprises metals, metal oxides, metal thiocyanates, metal nanowires and/or mixtures of these materials. These materials have the advantage that they are particularly easy to process. Preferably, the metal nanowires are silver nanowires and/or metal oxide nanowires. These have particularly excellent optical and electrical properties and thus provide an improvement and increase in performance of the component. The metal oxides are preferably transition metal oxides or metal oxides doped with metals and/or halogens. These are characterised by a particularly high work function and improve the effectiveness of the component. Of the above-mentioned materials, indium zinc oxide and/or fluorinated zinc oxide are particularly preferred. These materials are particularly robust and thus increase reliability. The metal thiocyanates are preferably transition metal thiocyanates as they are easy to process and thus reduce costs. Tungsten thiocyanate and/or copper thiocyanate are particularly preferable. These materials have been proved to be particularly maintenance-free and increase lifespan. In addition, they can be well electrically contacted.

All of the above-mentioned materials perform the function of the anode particularly well to serve as a supplier of electron holes and have a high work function and area conductivity for electron holes. In addition, the anode material may particularly preferably be selected such that it is transparent to visible light as the anode is preferably used to discharge the electromagnetically generated radiation (in the case of light-emitting diodes). In addition, the materials preferably have blocking properties against water or oxygen so that all of the OTR or WVTR of a combination of electrodes, injection layers or extraction layers and transport layers is preferably less than 0.01 cm$^3$/(m$^2$*d) or 0.01 g/(m$^2$*d).

However, it may also be preferable for all of the OTR or WVTR of a combination of electrodes, injection layers or extraction layers and transport layers to preferably be less than 0.1 cm$^3$/(m$^2$*d) or 0.1 g/(m$^2$*d). The desired OTR or WVTR properties may be correspondingly influenced by a suitable layer thickness of the anode material and by the material and thickness of the other layers.

Particularly preferably, the anode is made of an indium tin oxide (ITO) with a particularly preferably layer thickness of approx. 150 nm. For the purposes of the invention, details such as approx., about or synonymous terms are preferably to be understood as a tolerance of ±10%, particularly preferably of ±5% In a further particularly preferred variant, a thin silver layer is also applied to the ITO) preferably with a layer thickness of approx. 2 nm). This further increases the performance. In a further preferred variant, the anode consists of a layer of ITO of approx. 150 nm, a silver layer of approx. 2 nm and additionally a layer of tungsten oxide (WO$_3$ with a layer thickness of preferably approx. 2 nm). Advantageously, the application of these metal layers allows for a good provision of electron holes. Furthermore, with layer thicknesses of 1 nm to 5 nm, the materials are highly transparent. Thanks to the higher work function of tungsten oxide compared to silver, the preferred light-emitting diode can be operated with a particularly low operating voltage. Furthermore, it may also be preferably, in particular for the above-mentioned embodiments, for the ITO to be replaced by a fluorine tin oxide (FTO) or a chlorine tin oxide (CTO) or a chlorine zinc oxide (CZO) or a fluorine zinc oxide (FZO) or with metal nanowires, preferably silver nanowires embedded in a matrix of FTO, CTO, CZO or FZO. Thanks to their preferably optical properties, the above-mentioned materials contribute to the increased performance of the component. Likewise, the resulting increased brilliance and the reduced scattering achieved a special aesthetic effect.

In a further preferred embodiment, the optoelectronic component is characterised in that the anode has a layer thickness between 50 and 500 nm. Thus, a compact and flexible construction method of the optoelectronic component can be implemented which has the desired optical properties. Likewise, the desired OTR or WVTR properties of the entire layer system can be achieved. Furthermore, the electrical contacting of the anode is facilitated by said layer thickness and the required mechanical stability of the anode is provided.

In a preferred embodiment, the optoelectronic component is characterised in that the cathode comprises metals, metal oxides, metal thiocyanates, metal nanowires and/or mixtures of these materials. These materials are particularly robust and maintenance-free. The metals are preferably selected from a group comprising aluminium, copper, gallium, indium, tin, cobalt, nickel, which have a good workability and thus simplify production. The metal nanowires are preferably silver nanowires and/or metal oxide nanowires, which improve the performance of the component. The cathode particularly preferably comprises metal oxides doped with metals, which increase the quality of the component. Particularly preferably, the cathode comprises a zinc oxide doped with aluminium, which allows for an improvement of the electrical properties.

These materials allow the optimisation of the work function of the cathode and in particular an optimal provision of electrons in the case of light-emitting diodes. Thus, a particularly lower sheet resistance can be realised in order to facilitate the most uniform possible injection of the electrons across the surface of the cathode.

Particularly preferably, the cathode consists of a metal layer, preferably silver, which is preferably printed. In production this means a saving of time, materials and working stages, and consequently of costs. Likewise, in the visible wavelength range, silver has ideal optical (reflection) properties. Alternatively, however, vapour deposition of the metal may be preferable. Vapour deposition of the metal provides increased reliability during production. Besides silver, other metals such as aluminium, copper, Galinstan or alloys can preferably be used. These raw materials are characterised by good workability. The thickness of the cathode for these materials is preferably between 50 nm and 500 nm. Cathodes of this thickness can be particularly reliably produced. A layer thickness of the cathode of approx. 150 nm is particularly preferable. A cathode of this thickness is particularly effective.

In a further preferred variant, the cathode consists of a layer made of metal nanowires which are printed. Such a cathode can be produced particularly reliably and cost-effectively. Preferably, these are silver nanowires. These contribute to an increase in performance, especially due to the favourable optical and electrical properties. Alternatively, it may be preferable to use copper, cobalt or nickel nanowires. These can be processed particularly well and increase reliability. The metal nanowire layer preferably also has a thickness between 30 and 500 nm, which can be produced particularly reliably, is very robust and can be particularly easy to electrically contact. A layer thickness of approx. 150 nm is particularly preferable. These can be produced in a particularly error-free manner. It may be preferable for the metal nanowires to be embedded in a metal oxide matrix made of zinc oxide doped with aluminium. Thus, particularly advantageous electrical properties can be achieved. It may be particularly preferable for the cathode to be transparent. A particularly transparent light-emitting diode can be provided together with a preferably transparent anode. Due to the two-sided radiation behaviour, a particularly aesthetic effect and a surprising effect, which can be used for example in print advertising, is achieved.

Furthermore, the desired OTR or WVTR properties of the layer system comprising the cathode can be achieved by said materials and thicknesses of the cathode.

Furthermore, it may be preferable to adhere a metal film to the metal nanowires of the cathode. Thus, an increased reflection and an increased light emission can be obtained from the transparent anode. The metal film can preferably be a commercial aluminium film with a thickness of approx. 50 µm. Costs can thus be reduced. However, the metal film may also have a thickness in a range of 10 µm to 100 µm. The advantage of this embodiment is the flexibility to select desired properties with regard to degree of robustness, degree of reflection and flexibility of the component. Furthermore, the preferred metal film used can also be made of copper or other metals. Thus, the light output can be increased and adapted.

In a further preferred embodiment, the optoelectronic component is characterised in that the cathode has a layer thickness between 50 and 500 nm. Thus, a further means for extensive influence on the electrical and optical properties is provided. Preferably, the cathode should have a layer thickness between 100 nm and 200 nm. Such a cathode has been proven to be particularly robust and reliable.

In a further preferred embodiment of the invention, the optoelectronic component is characterised in that the optically active layer is an emitter layer with an emission spectrum preferably in a wavelength range between 400 nm and 700 nm. The light-generating layer preferably consists of semiconductive organic polymers or molecules which when excited electrically, i.e. the application of voltage to the electrodes, generate light in the visible range, preferably between 400 nm and 700 nm. Preferably, the emitter layer has a thickness of 15 nm to 100 nm. Thus, an increased performance of the light-generating layer in relation to its efficiency and the general optical properties is achieved. Particularly preferably, the emitter layer has a thickness of 40-60 nm. Such an emitter layer works very reliably and in a maintenance-free manner. In a preferred variant, the light-generating layer consists of 95% by weight of a polymer, which generates light in the visible spectrum upon electrical stimulation, and 5% by weight of a polymer having a higher band gap than the light-generating polymer. In this preferred variant, monochromatic light can be generated. In a further preferred embodiment, the emitter layer consists entirely of a polymer, which generates light in the visible spectrum upon electrical stimulation. Such an emitter layer is particularly robust. Furthermore, the emitter layer may preferably have various dopants to increase the conductivity and thus improve the efficiency (e.g. aluminium quinolate, tetrafluorotetracyanoquinodimethane, molybdenum oxide nanoparticles, metallocenes), or to vary the emission spectrum and electron photon efficiency (e.g. iridium quinolate complexes). However, for the purposes of the invention, completely different emitter layers can advantageously be used. The emitter layers are mostly susceptible to reactions with water or oxygen, so that their efficiency depends strongly on the exposure to these molecules. By providing an optical component which effectively protects the optically active layer, such as the emitter layer, from the permeation of water and oxygen, it is possible to use and adapt a wide variety of layers for the respective application. The preferred embodiment, which emits in the visible spectrum, is particularly suitable for commercial application.

In a further preferred embodiment of the invention, the optoelectronic component is characterised in that the optically active layer is an absorber layer with an absorption spectrum preferably in a range between 300 nm and 1500 nm. Preferably, polymer layers which absorb electrical radiation, preferably solar radiation, and generate free electron-hole pairs can be used as the absorber layer. Through said preferred ranges, a wide utilisation of solar energy for solar cells can be achieved. Advantageously, many materials known from the prior art can be used for the absorber layer. In particular, exclusion criteria relating to the sensitivity to water or oxygen relate to impairment of the lifespan, as the blocking properties of the further electrical layers effectively protect the optically active layer.

In a preferred embodiment, the invention further relates to a method for producing an optoelectronic component according to the invention or a preferred embodiment thereof, wherein the method is characterised in that the electron injection layer, the electron transport layer, the optically active layer, the hole transport layer and/or the hole injection layer are applied with a wet chemical method and/or a thermal evaporation method. Such methods represent an improvement in relation to the prior art and are particularly reliable. It is particularly preferable for the layers to be applied by screen printing, spin coating, offset printing, and/or gravure printing. These methods result in a saving of time, materials, working stages and costs. It is particularly preferable to apply the layers by means of an inkjet printing method. This method is particularly robust and efficient, and results in increased quality compared to conventional methods. The cathode and anode can particularly preferably be applied with a spraying method. This method provides increased reliability and makes production less expensive.

Thus, it is particularly preferable that the transport layers and the injection layers or extraction layers can be processed stably in the air. The above-mentioned materials and the method described here for applying the layers are particularly suitable for this purpose. "Processed stably in the air" in particular means that all steps required for the production of the component, in particular the application of the layers, can be carried out without limitation and special precautions in the surrounding room air. Thus, costs and time can be saved during production and efficiency increased.

Preferably, wet chemical processes are understood to mean production processes in which the materials for the individual layers, e.g. the polymers, are present in solutions and a coating is carried out using these solutions. The person skilled in the art is aware of suitable solvents as carriers for the respective components. Thermal vapour deposition is understood to mean preferred vacuum-based coating processes in which the materials for the layers are heated to a boiling point and are thus vapour-deposited onto the respective substrates.

By means of the above methods, it is possible to apply particularly homogeneous, pure layers having well-defined expansions. The inkjet printing method for the electrical layers as well as the optically active layer and the spraying method for the electrodes are also characterised by particularly lower production costs and a wide applicability to various substrates. Above all, thanks to the processability of the electroactive layers in air, the process can be realised without any special effort, in particular without using special vacuum or gas-filled chambers.

In the following, the invention will be described in greater detail using examples but without being limited to these.

DETAILED DESCRIPTION OF THE FIGURES

Figure 1:
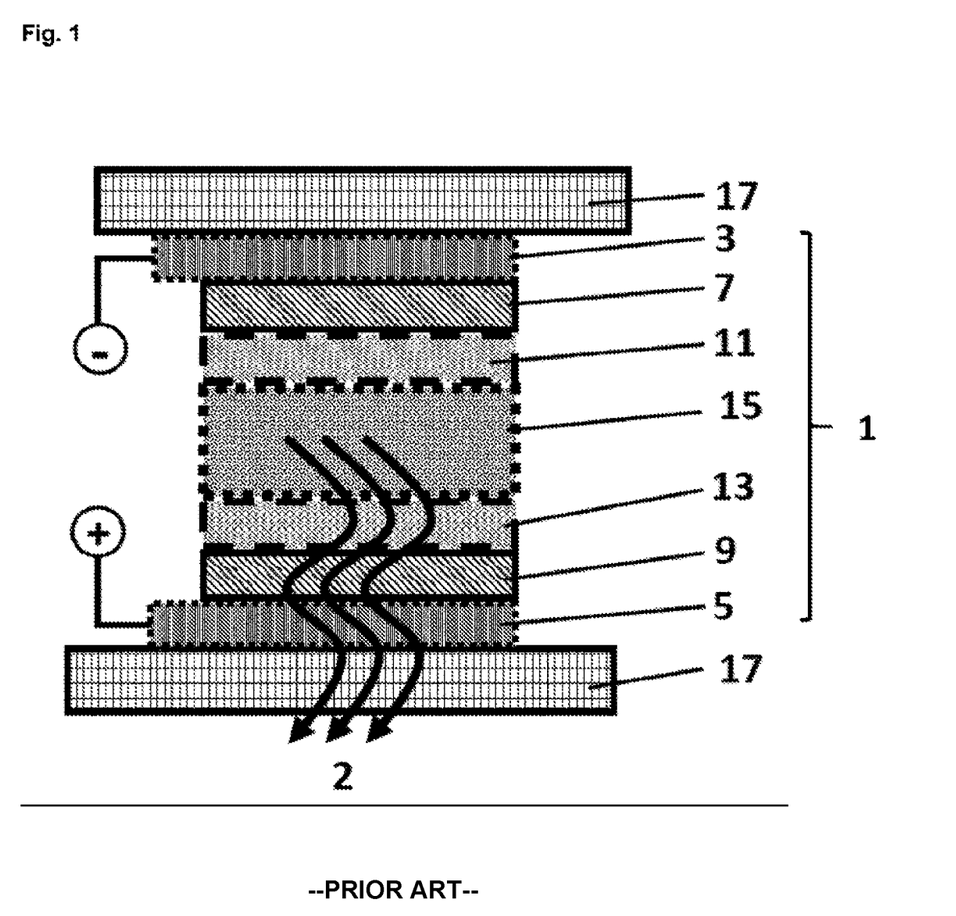
FIG. 1 Schematic representation of the layer structure of a conventional optoelectronic component which is encapsulated by a barrier film.
Figure 2:
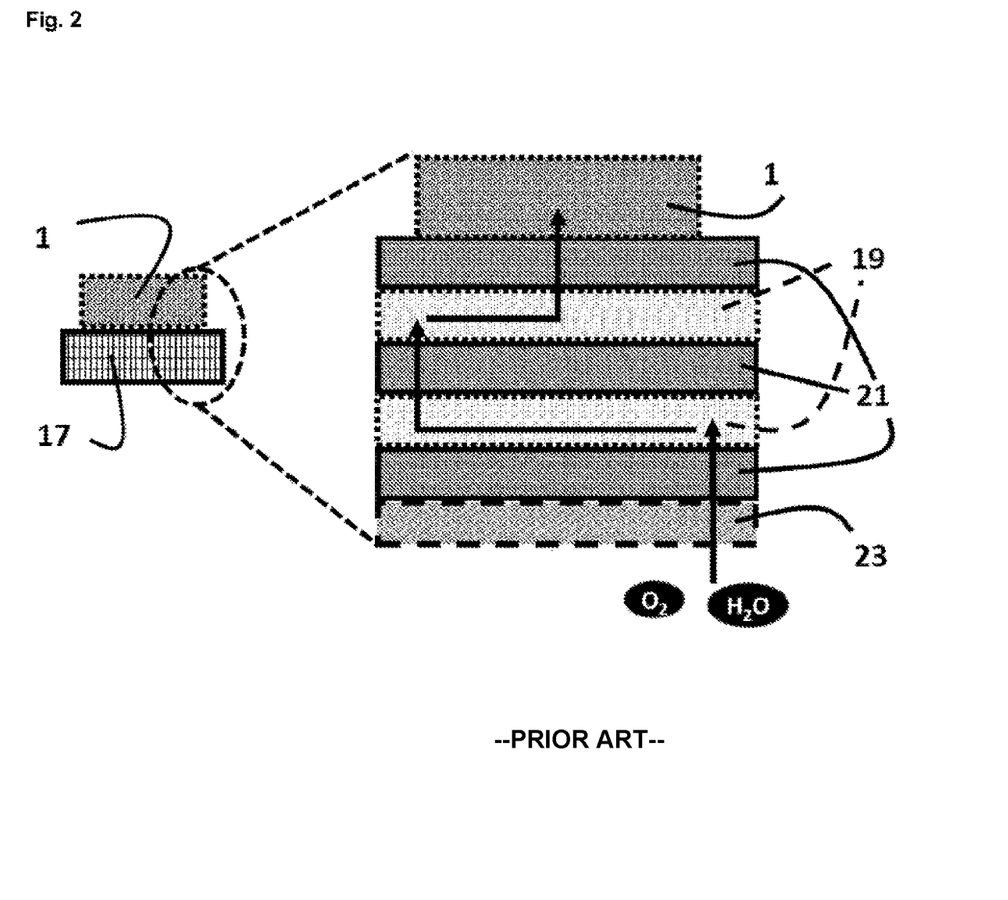
FIG. 2 Schematic zoom view of the layer structure of the barrier film for a conventional optical component.

FIGS. 1 and 2 show the schematic structure of a conventional optoelectronic component 1 which is encapsulated by a barrier film 17. The layer structure for the represented component 1 is that of a light-emitting diode and is composed as follows. A cathode 3 serves to provide electrons, while the anode 5 provides holes as soon as a voltage is applied to these electrodes. The symbols + and − each preferably show the voltage direction. The properties of the electron injection layer 7 and the hole injection layer 9 preferably allow for an efficient quantum mechanical tunnelling of the charge carriers to the transport layers. The electron transport layer 11 and the hole transport layer 13 are characterised by a high mobility for the charge carriers and ensure a targeted transport to the emitter layer 15. In the emitter layer 15, the charge carriers recombine to produce excitons and the emission of visible light 2. The penetration of water or oxygen into the emitter layer significantly reduces the efficiency coefficient and thus the lifespan. For this reason, in the prior art, the optoelectronic component 1 is encapsulated by a barrier film 17, which is intended to prevent penetration of water and oxygen. For this purpose, it is customary in the prior art to select an alternating layer structure in which diffusion-limiting layers 19 alternate with diffusion barriers or block layers 21. The diffusion barrier or block layer 21 should prevent the diffusion of molecules. However, there is also the possibility that molecules will diffuse through small defects. Due to the diffusion-limiting layers 19, the path length of the molecules is extended, so that they emerge again preferably through the defect in a diffusion barrier or block layer 21. Furthermore, in the prior the barrier film comprises a carrier substrate 23.

Figure 3:
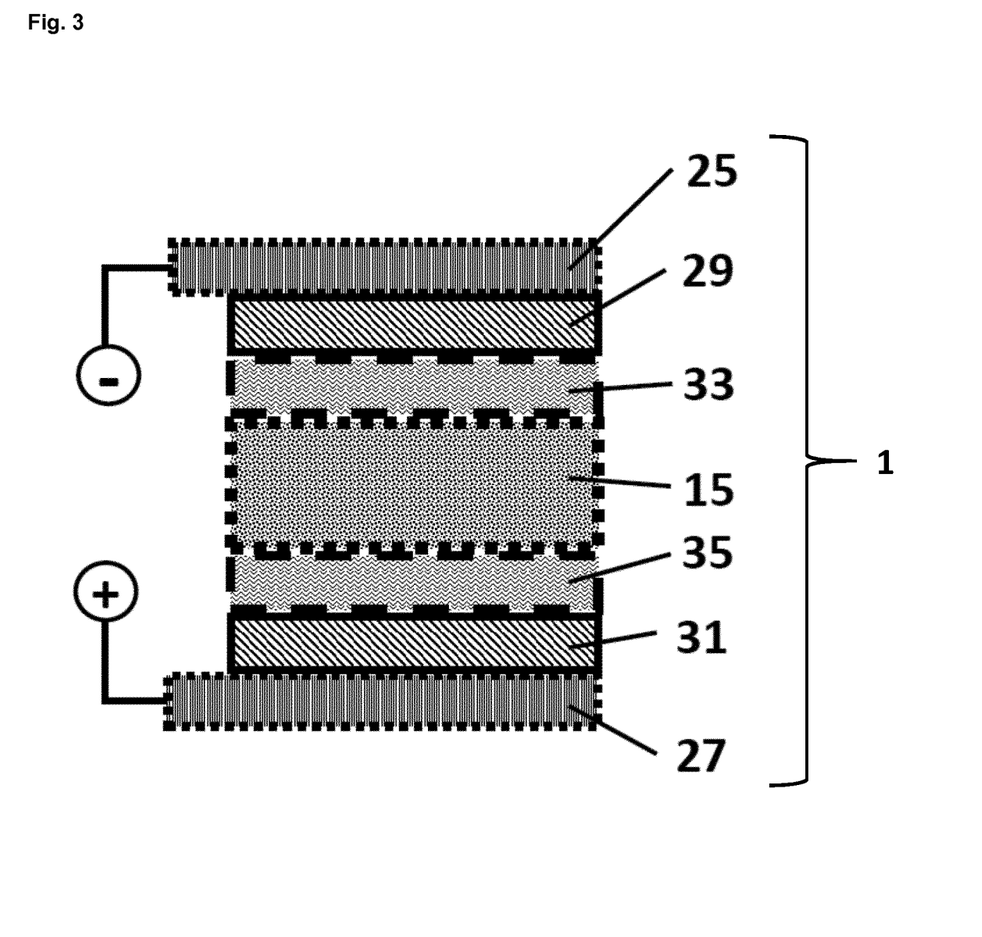
FIG. 3 Schematic representation of a preferred embodiment of the optoelectronic component according to the invention.

FIG. 3 shows a schematic representation of a preferred embodiment of the optoelectronic component according to the invention. The layer structure for the optoelectronic component 1 represented is that of a light-emitting diode. The basic functions of the layers in the layer structure are the same as those for conventional optoelectronic components according to FIG. 1 or 2. A cathode 25 serves to provide electrons, while the anode 27 provides holes as soon as a voltage is applied to these electrodes. The symbols + and − each preferably show the voltage direction. In addition, however, the cathode 25 and anode 27 have blocking properties against water and oxygen molecules, thus providing a diffusion barrier for the permeants.

The electrical properties of the electron injection layer 29 and the hole injection layer 31 preferably allow for an efficient quantum mechanical tunnelling of the charge carriers to the transport layers. At the same time, the materials of the electron injection layer 29 and the hole injection layer 31 are selected such that they have diffusion-limiting effects on water and oxygen molecules, so that the diffusion length of the molecules in the respective layer is extended.

The electron transport layer 33 and the hole transport layer 35 are characterised by a high mobility for the charge carriers and ensure a targeted transport to the emitter layer 15. In the emitter layer 15, the charge carriers recombine to produce excitons and the emission of visible light 2.

However, in contrast to the prior art, the electron transport layer 33 and the hole transport layer 35 provide a diffusion barrier to water and oxygen. The layer structure according to the invention thus facilitates an alternating layer structure of diffusion-limiting layers and diffusion barriers in the same way as the barrier film from the prior art. However, according to the invention it has been found that electrically active layers (electron injection layer 29, hole injection layer 31, electron transport layer 33 and hole transport layer 35) and the electrodes (cathode 25 and anode 27) themselves can be used as diffusion-limiting layers and diffusion barriers. The electron transport layer 33, the hole transport layer 35, the cathode 25 and the anode 27 thus function as diffusion barriers which should reduce the diffusion of water or oxygen molecules. The electron injection layer 29 and hole injection layer 31 function as diffusion-limiting layers which extend the path lengths of the molecules and thus defects of the diffusion barriers can be compensated for. In the preferred embodiment, the layer combination of the cathode 25, diffusion-limiting electron injection layer 29 and electron transport layer as a diffusion barrier 33 has an OTR of less than 0.1 $cm^3/(m^2*d)$, preferably less than 0.01 $cm^3/(m^2*d)$ and a WVTR of less than 0.1 $g/(m^2*d)$, preferably less than 0.01 $g/(m^2*d)$. Likewise, the layer combination of the anode 27, diffusion-limiting hole injection layer 31 and hole transport layer as a diffusion barrier 35 has an OTR of less than 0.1 $cm^3/(m^2*d)$, preferably less than 0.01 $cm^3/(m^2*d)$ and a WVTR of less than 0.1 $g/(m^2*d)$, preferably less than 0.01 $g/(m^2*d)$.

These parameters can prevent penetration of water and oxygen molecules into the emitter layer 15 and significantly increase the lifespan. Advantageously, this requires no complex and expensive barrier film which increases the overall thickness of the optoelectronic component 1.

It should be noted that various alternatives to the described embodiments of the invention might be used to carry out the invention and to arrive at the solution according to the invention. The optoelectronic component according to the invention and the production thereof in the described method are not limited in their embodiments to the above-mentioned preferred embodiments. Rather, a variety of design variants is conceivable that may differ from the illustrated solution. The aim of the claims is to define the scope of protection for the invention. The scope of protection of the claims is directed to covering the optoelectronic component according to the invention and the manufacturing method thereof as well as equivalent embodiments thereof.

LIST OF REFERENCE NUMERALS

1 Optoelectronic component
2 Light
3 Cathode
5 Anode
7 Electron injection layer
9 Hole injection layer
11 Electron transport layer
13 Hole transport layer
15 Emitter layer
17 Barrier film
19 Diffusion-limiting layers
21 Diffusion barrier
23 Carrier substrate
25 Cathode as diffusion barrier
27 Anode as diffusion barrier
29 Diffusion-limiting electron injection layer
31 Diffusion-limiting hole injection layer
33 Electron transport layer as diffusion barrier
35 Hole transport layer as diffusion barrier

The invention claimed is:

1. An optoelectronic component (1) having a cathode (25) and an anode (27) and a layer system between the cathode (25) and the anode (27) comprising
at least one electron injection layer (29) or electron extraction layer adjacent to the cathode,
at least one electron transport layer (33),
at least one optically active layer,
at least one hole transport layer (35),
at least one hole injection layer (31) or hole extraction layer adjacent to the anode, characterised in that the at least one electron injection layer (29) or electron extraction layer and the at least one hole injection layer (31) or hole extraction layer are diffusion-limiting to water and/or oxygen and having a water vapour transmission rate (WVTR) of less than 1 g/(m$^2$*d) and an oxygen transmission rate (OTR) of less than 1 cm$^3$/(m$^2$*d) and
the at least one electron transport layer (33) and the at least one hole transport layer (35) represent a diffusion barrier against water and/or oxygen and having a water vapour transmission rate (WVTR) of less than 0.1 g/(m$^2$*d) and an oxygen transmission rate (OTR) of less than 0.1 cm$^3$/(m$^2$*d).

2. The optoelectronic component (1) according to claim 1, characterised in that a layer combination of a cathode (25), the at least one electron injection layer (29) or electron extraction layer and the at least one electron transport layer (33) has a water vapour transmission rate (WVTR) of less than 0.1 g/(m$^2$*d) and an oxygen transmission rate (OTR) of less than 0.1 cm$^3$/(m$^2$*d) and/or a layer combination of an anode (27), the at least one hole injection layer (31) or hole extraction layer and the at least one electron transport layer (35) has a water vapour transmission rate (WVTR) of less than 0.1 g/($^2$*d) and an oxygen transmission rate (OTR) of less than 0.1 cm$^3$/(m$^2$*d).

3. An optoelectronic component (1) according to claim 1, characterised in that the at least one electron transport layer (33) and the at least one hole transport layer (35) have an oxygen transmission rate (OTR) of less than 1 cm$^3$/(m$^2$*d) and a water vapour transmission rate (WVTR) of less than 0.1 g/(m$^2$*d).

4. An optoelectronic component (1) according to claim 1, characterised in that the at least one electrode transport layer (33) has an electron mobility between 10$^{-6}$ cm$^2$/(V*s) and 100 cm$^2$/(V*s) and and the at least one hole transport layer (35) has a hole mobility between 10$^{-6}$ cm$^2$/(V*s) and 100 cm$^2$/(V*s).

5. An optoelectronic component (1) according to claim 1, characterised in that the at least one electron transport layer (33) has a doped metal oxide.

6. An optoelectronic component (1) according to claim 1, characterised in that the at least one hole transport layer (35) has a doped metal thiocyanate.

7. An optoelectronic component (1) according to claim 1, characterised in that the at least one electron transport layer (33) has an overall layer thickness of 10-50 nm, and the at least one hole transport layer (35) has an overall layer thickness of 10-40 nm.

8. An optoelectronic component (1) according to claim 1, characterised in that the at least one electron injection layer (29) or electron extraction layer and the at least one hole injection layer (31) or hole extraction layer have an oxygen transmission rate (OTR) of less than 1 cm$^3$/(m$^2$*d) and a water vapour transmission rate (WVTR) of less than 1 g/(m$^2$*d).

9. An optoelectronic component (1) according to claim 1, characterised in that the at least one electron injection layer (29) or electron extraction layer comprises dielectric polymers.

10. An optoelectronic component (1) according to claim 1, characterised in that the at least one hole injection layer (31) or hole extraction layer comprises dielectric polymers.

11. An optoelectronic component (1) according to claim 1, characterised in that the at least one electron injection layer (29) or electron extraction layer has an overall layer thickness between 0.1 nm and 10 nm and the at least one hole injection layer or hole extraction layer has an overall layer thickness between 0.1 nm and 10 nm.

12. An optoelectronic component (1) according to claim 1, characterised in that the component (1) has at least two electron injection layers (29) or electron extraction layers, at least two electron transport layers (33), at least two hole transport layers (35) and at least two hole injection layers (31) or hole extraction layers, wherein the electron injection layers (29) or electron extraction layers and the electron transport layers (33) and the hole injection layers (31) or hole extraction layers and the hole transport layers (35) are arranged in an alternating arrangement.

13. An optoelectronic component (1) according to claim 1, characterised in that the anode (27) is at least one of metals, metal oxides, metal thiocyanates, metal nanowires, halogens and/or mixtures of these metals.

14. An optoelectronic component (1) according to claim 1, characterised in that the anode (27) has a layer thickness between 50 and 500 nm.

15. An optoelectronic component (1) according to claim 1, characterised in that the cathode (25) is at least one of metals, metal oxides, metal thiocyanates, metal nanowires and/or mixtures of these materials.

16. An optoelectronic component (1) according to claim 1, characterised in that the cathode (25) has a layer thickness between 50 nm and 500 nm.

17. An optoelectronic component (1) according to claim 1, characterised in that the optically active layer is an emitter layer (15).

18. An optoelectronic component (1) according to claim 1, characterised in that the optically active layer is an absorber layer with an absorption spectrum.

19. A method for producing an optoelectronic component (1) according to claim 1, characterised in that the electron injection layer (29), the electron transport layer (33), the optically active layer, the hole transport layer (35) and/or the hole injection layer (31) are applied with a wet chemical method and/or a thermal evaporation method.

* * * * *